(12) United States Patent
Huangfu

(10) Patent No.: US 11,294,272 B2
(45) Date of Patent: Apr. 5, 2022

(54) DONOR SUBSTRATE FOR DEPOSITING DEPOSITION MATERIAL ON ACCEPTOR SUBSTRATE, METHOD OF DEPOSITING DEPOSITION MATERIAL, AND METHOD OF FABRICATING DONOR SUBSTRATE

(71) Applicant: BOE Technology Group Co., Ltd., Beijing (CN)

(72) Inventor: Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 663 days.

(21) Appl. No.: 16/302,799

(22) PCT Filed: Dec. 14, 2017

(86) PCT No.: PCT/CN2017/116190
§ 371 (c)(1),
(2) Date: Nov. 19, 2018

(87) PCT Pub. No.: WO2019/113891
PCT Pub. Date: Jun. 20, 2019

(65) Prior Publication Data
US 2021/0223682 A1    Jul. 22, 2021

(51) Int. Cl.
*G03F 1/38* (2012.01)
*C23C 14/24* (2006.01)
*H01L 51/00* (2006.01)

(52) U.S. Cl.
CPC ............. *G03F 1/38* (2013.01); *C23C 14/24* (2013.01); *H01L 51/003* (2013.01); *H01L 51/0013* (2013.01)

(58) Field of Classification Search
CPC .... C23C 14/24; H01L 51/0013; H01L 51/003
See application file for complete search history.

(56) References Cited

U.S. PATENT DOCUMENTS

| | | | |
|---|---|---|---|
| 6,114,088 A | 9/2000 | Wolk et al. | |
| 6,140,009 A | 10/2000 | Wolk et al. | |
| 6,214,520 B1 | 4/2001 | Wolk et al. | |
| 6,596,610 B1 * | 7/2003 | Kuwabara | H01L 22/34 438/458 |
| 9,397,296 B2 | 7/2016 | Yu | |

(Continued)

FOREIGN PATENT DOCUMENTS

| CN | 1196602 C | 4/2005 |
|---|---|---|
| CN | 101471423 A | 7/2009 |

(Continued)

OTHER PUBLICATIONS

International Search Report & Written Opinion dated Sep. 12, 2018, regarding PCT/CN2017/116190.

(Continued)

*Primary Examiner* — Robert A Vetere
(74) *Attorney, Agent, or Firm* — Intellectual Valley Law, P.C.

(57) ABSTRACT

The present application discloses a donor substrate for depositing a deposition material on an acceptor substrate. The donor substrate includes a base substrate; a patterned thermal barrier layer on the base substrate; and a plurality of openings each of which extending through the patterned thermal barrier layer.

12 Claims, 5 Drawing Sheets

(56) References Cited

U.S. PATENT DOCUMENTS

| | | | |
|---|---|---|---|
| 2001/0036561 A1 | 11/2001 | Wolk et al. | |
| 2009/0166563 A1 | 7/2009 | Yokoyama et al. | |
| 2009/0169809 A1 | 7/2009 | Yokoyama et al. | |
| 2012/0088324 A1* | 4/2012 | Yokoyama | C23C 14/048 438/29 |
| 2014/0017395 A1* | 1/2014 | Yoon | C23C 14/12 427/66 |
| 2014/0295587 A1 | 10/2014 | Lee et al. | |
| 2016/0085146 A1 | 3/2016 | Kwon | |
| 2018/0066351 A1 | 3/2018 | Liang et al. | |

FOREIGN PATENT DOCUMENTS

| | | |
|---|---|---|
| CN | 104078620 A | 10/2014 |
| CN | 104762599 A | 7/2015 |
| CN | 106119779 A | 11/2016 |
| CN | 205856590 U | 1/2017 |
| EP | 2509396 A1 | 10/2012 |

OTHER PUBLICATIONS

A novel RGB color patterning method for Organic Light-Emitting-Diodes: Joule-heating Induced Color Patterning (JICP), Won-Eui Hong et al., SID 2015 Digest, p. 601-604 (2015).

Partial supplementary European Search Report in the European Patent Application No. 17916457.9, dated Jul. 27, 2021.

Extended European Search Report in the European Patent Application No. 17916457.9, dated Nov. 24, 2021.

\* cited by examiner

DONOR SUBSTRATE FOR DEPOSITING DEPOSITION MATERIAL ON ACCEPTOR SUBSTRATE, METHOD OF DEPOSITING DEPOSITION MATERIAL, AND METHOD OF FABRICATING DONOR SUBSTRATE

CROSS-REFERENCE TO RELATED APPLICATION

This application is a national stage application under 35 U.S.C. § 371 of International Application No. PCT/CN2017/116190, filed Dec. 14, 2017, the contents of which are incorporated by reference in the entirety.

TECHNICAL FIELD

The present invention relates to display technology, more particularly, to a donor substrate for depositing a deposition material on an acceptor substrate, a method of depositing a deposition material on an acceptor substrate, and a method of fabricating a donor substrate for depositing a deposition material on an acceptor substrate.

BACKGROUND

In a conventional process of making an organic light emitting diode (OLED), the organic light emitting material is evaporated onto a substrate using an evaporation crucible. Specifically, the organic light emitting material is placed inside the evaporation crucible having a heating source. When power is applied to the heating source, the organic light emitting material evaporates or sublimes into a vapor. The evaporated or sublimed vapor condenses when it reaches the substrate on top of the evaporation crucible. The organic light emitting material is deposited on the substrate.

SUMMARY

In one aspect, the present invention provides a donor substrate for depositing a deposition material on an acceptor substrate, comprising a base substrate; a patterned thermal barrier layer on the base substrate; and a plurality of openings each of which extending through the patterned thermal barrier layer.

Optionally, the patterned thermal barrier layer has a thermal conductivity at room temperature of less than 0.50 $W \cdot m^{-1} \cdot K^{-1}$.

Optionally, the patterned thermal barrier layer is made of a photoresist thermal barrier material.

Optionally, the photoresist thermal barrier material comprises polyimide.

Optionally, each of the plurality of openings has a first side exposing the base substrate and a second side exposing the patterned thermal barrier layer, the second side being connected to the first side; and an included angle between the second side and the first side is in a range of approximately 85 degrees to approximately 95 degrees.

In another aspect, the present invention provides an evaporation apparatus, comprising a donor substrate described herein or fabricated by a method described herein; and a crucible configured to deposit an evaporated deposition material on the donor substrate.

In another aspect, the present invention provides a method of depositing a deposition material on into a plurality of target regions of an acceptor substrate, comprising providing a donor substrate with a patterned thermal barrier layer; depositing an evaporated deposition material on the donor substrate; and heating the donor substrate thereby transferring the evaporated deposition material on the patterned thermal barrier layer to the acceptor substrate; wherein the donor substrate comprises a base substrate; the patterned thermal barrier layer on the base substrate; and a plurality of openings each of which extending through the patterned thermal barrier layer.

Optionally, the evaporated deposition material is deposited on the base substrate in the plurality of openings thereby forming a first deposition material layer, and deposited on the patterned thermal barrier layer outside the plurality of openings thereby forming a second deposition material layer.

Optionally, the method further comprises providing an acceptor substrate on a side of the patterned thermal barrier layer of the donor substrate distal to the base substrate; substantially uniformly heating the base substrate of the donor substrate to a first temperature at which a deposition material in the first deposition material layer is evaporated; and depositing the deposition material evaporated from the first deposition material layer into the plurality of target regions of the acceptor substrate.

Optionally, subsequent to depositing the deposition material evaporated from the first deposition material layer into the plurality of target regions in the acceptor substrate, the method further comprises separating the donor substrate and the acceptor substrate by a distance to discontinue deposition of the deposition material from the donor substrate to the acceptor substrate.

Optionally, the method further comprises controlling a heating rate and a heating duration of heating the base substrate of the donor substrate such that a deposition material in the second deposition material layer is substantially unevaporated during depositing the deposition material evaporated from the first deposition material layer into the plurality of target regions in the acceptor substrate; wherein the heating rate and the heating duration are controlled such that a second temperature of the patterned thermal barrier layer during the heating is below an evaporation temperature of the deposition material in the second deposition material layer.

Optionally, subsequent to separating the donor substrate and the acceptor substrate, the method further comprises heating the donor substrate to remove the deposition material in the second deposition material layer and a residual deposition material in the first deposition material layer; and cooling the donor substrate.

Optionally, subsequent to depositing the deposition material evaporated from the first deposition material layer into the plurality of target regions in the acceptor substrate, the method further comprises cooling the donor substrate to a second temperature at which the deposition material in the first deposition material layer is substantially unevaporated; heating the base substrate of the donor substrate to a third temperature at which a remaining deposition material in the first deposition material layer is evaporated; and depositing the remaining deposition material evaporated from the first deposition material layer into the plurality of target regions in the acceptor substrate.

Optionally, the deposition material evaporated from the first deposition material layer is deposited into a plurality of first regions in the acceptor substrate thereby forming a third deposition material layer on the acceptor substrate, each of the plurality of first regions corresponding to one of the plurality of target regions in the acceptor substrate; and each of the plurality of first regions comprises a second region in which the third deposition material layer has a substantially uniform thickness.

Optionally, during depositing the deposition material evaporated from the first deposition material layer into the plurality of target regions in the acceptor substrate, the acceptor substrate and the donor substrate are spaced apart by a distance such that the second region is larger than one of the plurality of target regions corresponding to the second region, and each of the plurality of first regions is substantially non-overlapping with an adjacent target region of the plurality of target regions.

Optionally, the plurality of first regions are substantially non-overlapping with each other.

Optionally, prior to depositing the evaporated deposition material on the donor substrate, the method further comprises cooling the donor substrate.

In another aspect, the present invention provides a display apparatus, wherein at least one layer of the display apparatus is fabricated by the method of depositing a deposition material described herein.

Optionally, the display apparatus is an organic light emitting diode display apparatus; and the at least one layer comprises an organic light emitting layer.

In another aspect, the present invention provides a method of fabricating a donor substrate for depositing a deposition material on an acceptor substrate, comprising forming a thermal barrier material layer on the base substrate; and forming a plurality of openings each of which extending through the thermal barrier material layer and exposing the base substrate.

Optionally, forming the thermal barrier material layer comprises forming the thermal barrier material layer using a photoresist thermal barrier material; and forming the plurality of openings comprises exposing the thermal barrier material layer using a mask plate to obtain an exposed thermal barrier material layer; and developing the exposed thermal barrier material layer to obtain the patterned thermal barrier layer and the plurality of openings.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional process of fabricating an organic light emitting diode apparatus, the organic material is deposited onto the substrate using a fine metal mask plate. There are many issues associated with the conventional process. First, the process of fabricating the fine metal mask plate in itself is a complicated process. Second, the alignment between the fine metal mask plate and the substrate presents an issue during the fabrication process. Third, the final metal mask plate is prone to deformation due to the heat during the deposition process. Typically, the final metal mask plate is spaced apart from the nozzles by a relatively large distance to minimize the deformation, resulting in a reduced material utilization rate.

Accordingly, the present disclosure provides, inter alia, a donor substrate for depositing a deposition material on an acceptor substrate, a method of depositing a deposition material on an acceptor substrate, and a method of fabricating a donor substrate for depositing a deposition material on an acceptor substrate that substantially obviate one or more of the problems due to limitations and disadvantages of the related art. In one aspect, the present disclosure provides a donor substrate for depositing a deposition material on an acceptor substrate. In some embodiments, the donor substrate includes a base substrate, a patterned thermal barrier layer on the base substrate, and a plurality of openings each of which extending through the patterned thermal barrier layer. Optionally, each of the plurality of openings exposes the base substrate.

Figure 1:
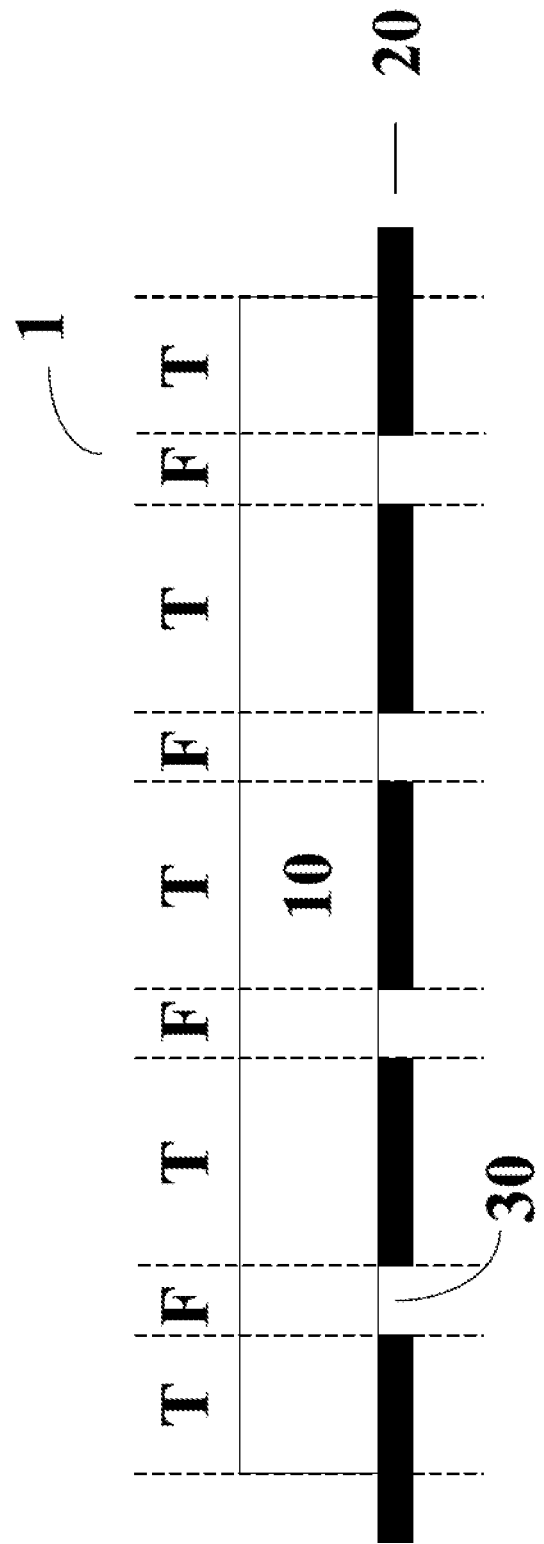
FIG. 1 is a schematic diagram illustrating the structure of a donor substrate in some embodiments according to the present disclosure.

FIG. 1 is a schematic diagram illustrating the structure of a donor substrate in some embodiments according to the present disclosure. Referring to FIG. 1, the donor substrate 1 in some embodiments includes a base substrate 10, a patterned thermal barrier layer 20 on the base substrate 10, and a plurality of openings 30 each of which extending through the patterned thermal barrier layer 20. In the context of the present disclosure, the donor substrate 1 is used as a transfer substrate for transferring a deposition material onto an acceptor substrate (e.g., a substrate in which one or more layers are to be formed). In one example, the acceptor substrate is a substrate in which one or more organic light emitting layer are to be formed by transferring an organic light emitting material from the donor substrate 1 to the acceptor substrate. Accordingly, the plurality of openings 30 in the donor substrate 1 correspond to a plurality of target regions in the acceptor substrate. The plurality of target regions in the acceptor substrate may be a plurality of regions in which one or more layers are to be formed. Optionally, the plurality of target regions in the acceptor substrate correspond to a plurality of subpixel regions in the acceptor substrate. Optionally, each of the plurality of openings 30 has an area substantially the same as that of each of the plurality of target regions in the acceptor substrate. Optionally, each of the plurality of openings 30 has an area larger than (e.g., by 5%, 10%, 15%, etc.) that of each of the plurality of target regions in the acceptor substrate. Optionally, each of the plurality of openings 30 has an area smaller than (e.g., by 5%, 10%, 15%, etc.) that of each of the plurality of target regions in the acceptor substrate.

As used herein, the term "thermal barrier" refers to a layer or a material over a substrate that is capable of reducing thermal transfer to and from the underlying substrate, e.g., capable of reducing heat flow from the underlying substrate across a patterned thermal barrier layer overlaid on the underlying substrate. Optionally, the thermal barrier has a thermal conductivity that is no more than one tenth of the thermal conductivity of the underlying substrate. Optionally, the thermal barrier has a thermal conductivity at room temperature of less than 0.50 $W \cdot m^{-1} \cdot K^{-1}$. Optionally, the thermal conductivity at room temperature of the thermal barrier is less than 0.45, 0.40, 0.35, 0.30, 0.25, 0.20, 0.15, 0.10, 0.08, 0.06, 0.05, 0.04, 0.03, or 0.02 $W \cdot m^{-1} \cdot K^{-1}$. Optionally, a patterned thermal barrier layer includes a single layer. Optionally, a patterned thermal barrier layer includes multiple sublayers. Various appropriate thermal barrier materials may be used in the present disclosure. Examples of appropriate thermal barrier materials include various organic thermal barrier materials, various inorganic thermal barrier materials such as various heat insulating ceramic materials. Examples of organic thermal barrier materials include polyimide. Examples of heat insulating ceramic materials include aluminum oxide.

Accordingly, the donor substrate 1 in some embodiments includes a thermal barrier region T which is occupied by the patterned thermal barrier layer 20, and a thermal barrier-free region F unoccupied by the patterned thermal barrier layer 20 and corresponding to the plurality of openings 30. The structure and composition of the base substrate 10 in the thermal barrier region T and in the thermal barrier-free region F are substantially uniform. For example, the base substrate 10 in the thermal barrier region T underneath the patterned thermal barrier layer 20 and in the thermal barrier-free region F exposed to the plurality of openings 30 have substantially the same material. Optionally, the patterned thermal barrier layer 20 is in contact with the base substrate 10.

In some embodiments, the donor substrate 1 is configured to be substantially uniformly heated throughout the entire base substrate 10. For example, the base substrate 10 in the thermal barrier region T and the thermal barrier-free region F are configured to be heated substantially uniformly. The donor substrate 1 does not include a heating structure configured to selectively heat the thermal barrier-free region F or selectively heat the thermal barrier region T. Due to the presence of the patterned thermal barrier layer 20 in the thermal barrier region T, a substance deposited on the surface of the patterned thermal barrier layer 20 is blocked from the heat in the base substrate 10, or it takes much longer time for the heat from the base substrate 10 in the thermal barrier region T to transmit to the substance deposited on the surface of the patterned thermal barrier layer 20. A substance deposited on the surface of the base substrate 10 in the thermal barrier-free region F (e.g., in the plurality of openings 30) is directly heated by the base substrate 10 in the thermal barrier-free region F without the need of additional heating structure, due to the absence of the patterned thermal barrier layer 20 in the thermal barrier-free region F. Optionally, structures of the thermal barrier region T and the thermal barrier-free region F of the donor substrate 1 are identical except for the presence or absence of the patterned thermal barrier layer 20.

In some embodiments, the base substrate 10 includes multiple layers. Optionally, the base substrate 10 includes a heating layer configured to heat the base substrate substantially uniformly. Optionally, the heating layer is the layer in contact with the patterned thermal barrier layer 20 in the thermal barrier region T and exposed to the plurality of openings 30 in the thermal barrier-free region F. Optionally, the heating layer is configured to heat the base substrate 10 in the thermal barrier region T and in the thermal barrier-free region F non-selectively. Optionally, the base substrate 10 further includes a heat spreading layer configured to substantially uniformly distribute heat transmitted from the heating layer. Optionally, the heat spreading layer is the layer in contact with the patterned thermal barrier layer 20 in the thermal barrier region T and exposed to the plurality of openings 30 in the thermal barrier-free region F. Optionally, the heat spreading layer is configured to distribute heat to the base substrate 10 in the thermal barrier region T and in the thermal barrier-free region F non-selectively. Optionally, the base substrate 10 further includes a cooling layer configured to cool the base substrate 10. In a multi-layer structure, the layer that is in contact with the patterned thermal barrier layer 20 in the thermal barrier region T and exposed to the plurality of openings 30 in the thermal barrier-free region F is a continuous layer extending through the thermal barrier region T and the thermal barrier-free region F. The structure and composition of the continuous layer in the thermal barrier region T and the thermal barrier-free region F are substantially uniform. Optionally, the continuous layer of the multi-layer structure in the thermal barrier region T underneath the patterned thermal barrier layer 20 and in the thermal barrier-free region F exposed to the plurality of openings 30 have substantially the same material.

Figure 2:
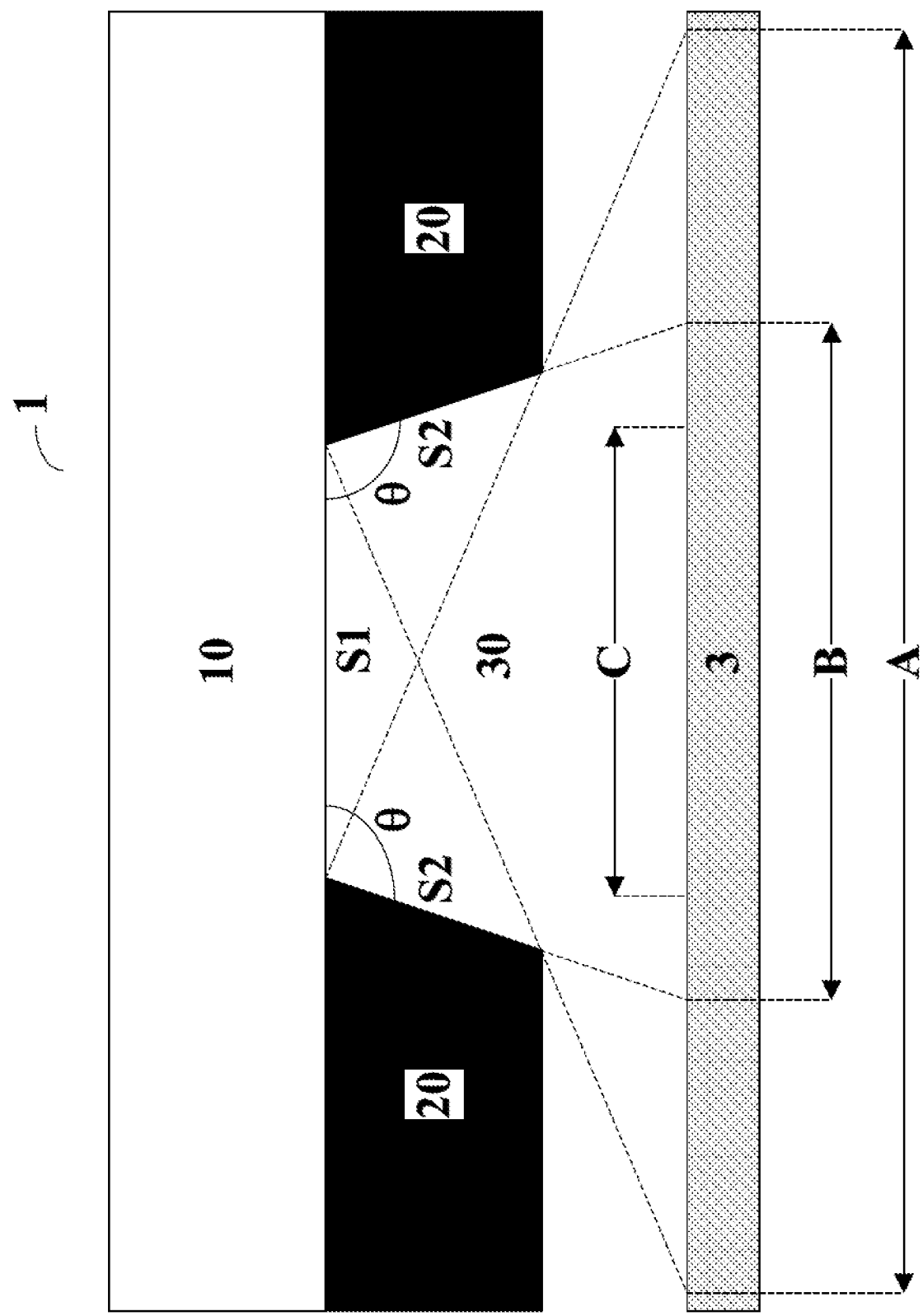
FIG. 2 is a schematic diagram illustrating the structure of one of the plurality of openings in a donor substrate in some embodiments according to the present disclosure.

FIG. 2 is a schematic diagram illustrating the structure of one of the plurality of openings in a donor substrate 1 in some embodiments according to the present disclosure. Referring to FIG. 2, an acceptor substrate 3 is placed opposite to the donor substrate 1. The acceptor substrate 3 is aligned with the donor substrate 1, e.g., each of the plurality of openings 30 is aligned with one of a plurality of target regions C in the acceptor substrate 3.

Referring to FIG. 2, each of the plurality of openings 30 has a first side S1 exposing the base substrate 10 and a second side S2 exposing the patterned thermal barrier layer 20. The second side S2 is connected to the first side S1. As shown in FIG. 2, the second side S2 and the first side S1 form an included angle θ. Optionally, the included angle θ between the second side S2 and the first side S1 is in a range of approximately 70 degrees to approximately 110 degrees, e.g., approximately 80 degrees to approximately 100 degrees, approximately 85 degrees to approximately 95 degrees, approximately 90 degrees to approximately 95 degrees, and approximately 90 degrees.

By having this design, a deposition material evaporated from the first side S1 of one of the plurality of openings 30 is configured to deposit into one of a plurality of first regions A in the acceptor substrate 3, forming a deposition material layer on the acceptor substrate 3. Each of the plurality of first regions A in the acceptor substrate 3 corresponds to one of the plurality of target regions C in the acceptor substrate. Each of the plurality of first regions A includes a second region B in which the deposition material layer has a substantially uniform thickness. The deposition material layer outside the second region B may have a thickness less than that in the second region B. Optionally, to ensure formation of a deposition material layer in each of the plurality of target regions C having a substantially uniform thickness, the donor substrate 1 and the structure of the plurality of openings 30 are designed such that the second region B is larger than the corresponding one of the plurality of target regions C, e.g., an orthographic projection of the second region B on the base substrate 10 covers an orthographic projection of the corresponding one of the plurality of target regions C on the base substrate 10. Optionally, each of the plurality of first regions A is substantially non-overlapping with a target region of the plurality of target regions C adjacent thereto. Optionally, the plurality of first regions A are substantially non-overlapping with each other.

Various appropriate thermal barrier materials and various appropriate methods may be used for making the patterned thermal barrier layer 20. In some embodiments, the patterned thermal barrier layer 20 is made of a photoresist thermal barrier material, e.g., a photoresist thermal barrier material having polyimide.

In another aspect, the present disclosure provides a method of fabricating a donor substrate for depositing a deposition material on an acceptor substrate. In some embodiments, the method includes forming a thermal barrier material layer on the base substrate; and forming a plurality of openings each of which extending through the thermal barrier material layer and exposing the base substrate. Optionally, the step of forming the thermal barrier material layer includes forming the thermal barrier material layer using a photoresist thermal barrier material (e.g., a polyimide). Optionally, the step of forming the plurality of openings includes exposing the thermal barrier material layer using a mask plate to obtain an exposed thermal barrier material layer; and developing the exposed thermal barrier material layer to obtain the patterned thermal barrier layer and the plurality of openings.

Figure 3A:
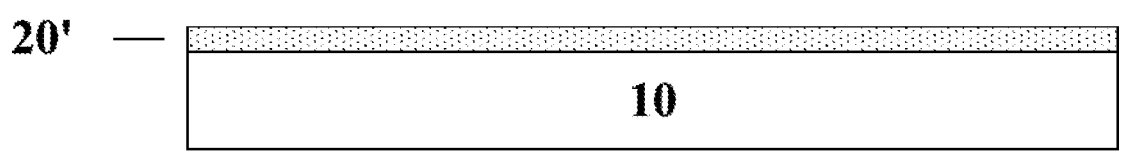
FIGS. 3A to 3C illustrate a process of fabricating a donor substrate in some embodiments according to the present disclosure.
Figure 3B:
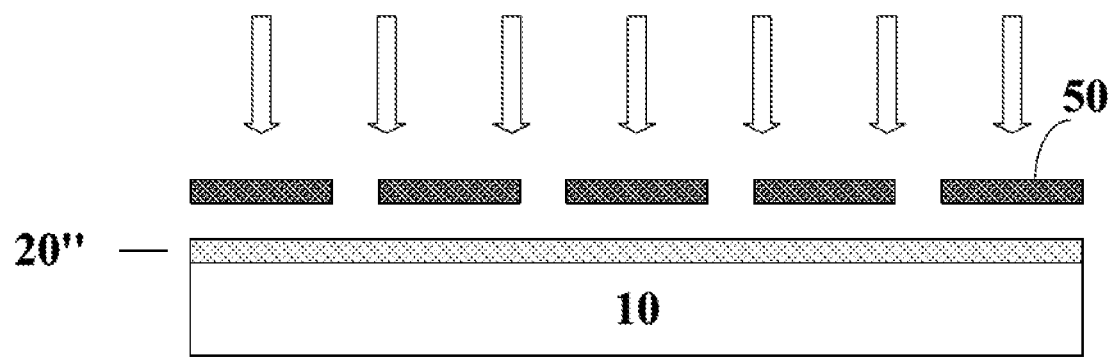
Figure 3C:
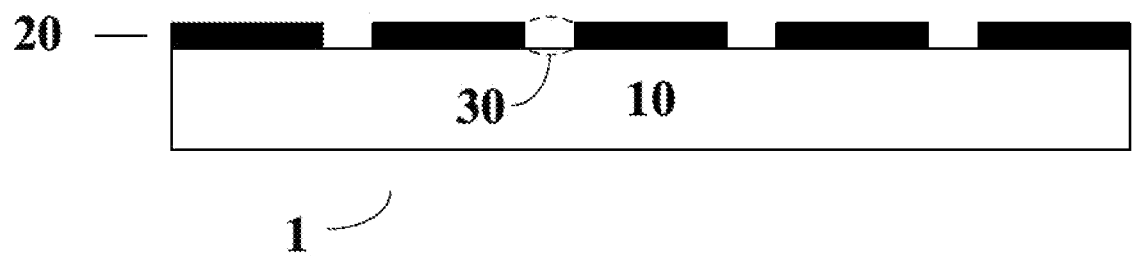

FIGS. 3A to 3C illustrate a process of fabricating a donor substrate in some embodiments according to the present disclosure. Referring to FIG. 3A, a photoresist thermal barrier material layer 20' is formed on a base substrate 10. The photoresist thermal barrier material layer 20' includes a photoresist thermal barrier material (e.g., polyimide). Referring to FIG. 3B, the thermal barrier material layer 20' is exposed using a mask plate 50 to obtain an exposed thermal barrier material layer 20". Referring to FIG. 3C, the exposed thermal barrier material layer 20" is developed to obtain a patterned thermal barrier layer 20 and a plurality of openings 30. Each of the plurality of openings 30 extends through the patterned thermal barrier layer 20, exposing the base substrate 10 underneath.

Various alternative methods may be used for making the patterned thermal barrier layer 20. In one example, the patterned thermal barrier layer 20 may be ink-jet printed on the base substrate 10. In another example, the patterned thermal barrier layer 20 may be fabricated by screening printing.

In another aspect, the present disclosure provides a method of depositing a deposition material on an acceptor substrate. In some embodiments, the method includes providing a donor substrate described herein or fabricated by a method described herein, depositing an evaporated deposition material on the donor substrate; and heating the donor substrate thereby transferring the evaporated deposition material on the patterned thermal barrier layer to the acceptor substrate. Optionally, the evaporated deposition material is deposited on the base substrate in the plurality of openings thereby forming a first deposition material layer, and deposited on the patterned thermal barrier layer outside the plurality of openings thereby forming a second deposition material layer. Optionally, the method further includes providing an acceptor substrate on a side of the patterned thermal barrier layer of the donor substrate distal to the base substrate; substantially uniformly heating the base substrate of the donor substrate to a first temperature at which a deposition material in the first deposition material layer is evaporated; and depositing the deposition material evaporated from the first deposition material layer into the plurality of target regions in the acceptor substrate. Optionally, prior to substantially uniformly heating the base substrate, the method further includes aligning the plurality of openings in the donor substrate with a plurality of target regions in the acceptor substrate. Optionally, subsequent to depositing the deposition material evaporated from the first deposition material layer into the plurality of target regions in the acceptor substrate, the method further includes separating the donor substrate and the acceptor substrate by a distance to discontinue deposition of the deposition material from the donor substrate to the acceptor substrate. Optionally, the method further includes controlling a heating rate and a heating duration of heating the base substrate of the donor substrate such that a deposition material in the second deposition material layer is substantially unevaporated during depositing the deposition material evaporated from the first deposition material layer into the plurality of target regions in the acceptor substrate. Optionally, the heating rate and the heating duration are controlled such that a second temperature of the patterned thermal barrier layer during the heating is below an evaporation temperature of the deposition material in the second deposition material layer. Optionally, subsequent to separating the donor substrate and the acceptor substrate, the method further includes heating the donor substrate to remove the deposition material in the second deposition material layer and a residual deposition material the first deposition material layer; and cooling the donor substrate.

In some embodiments, subsequent to depositing the deposition material evaporated from the first deposition material layer into the plurality of target regions in the acceptor substrate, the method further includes cooling the donor substrate to a second temperature at which the deposition material in the first deposition material layer is substantially unevaporated; heating the base substrate of the donor substrate to a third temperature at which a remaining deposition material in the first deposition material layer is evaporated; and depositing the remaining deposition material evaporated from the first deposition material layer into the plurality of target regions in the acceptor substrate. Optionally, the deposition material evaporated from the first deposition material layer is deposited into a plurality of first regions in the acceptor substrate thereby forming a third deposition material layer on the acceptor substrate, each of the plurality of first regions corresponding to one of the plurality of target regions in the acceptor substrate; and each of the plurality of first regions comprises a second region in which the third deposition material layer has a substantially uniform thickness. Optionally, during depositing the deposition material evaporated from the first deposition material layer into the plurality of target regions in the acceptor substrate, the acceptor substrate and the donor substrate are spaced apart by a distance such that the second region is larger than one of the plurality of target regions corresponding to the second region, and each of the plurality of first regions is substantially non-overlapping with a target region of the plurality of target regions adjacent thereto. Optionally, the plurality of first regions are substantially non-overlapping with each other.

Optionally, prior to depositing the evaporated deposition material on the donor substrate, the method further includes cooling the donor substrate.

As used herein, the term "evaporation" refers to the phase transition of a solid or liquid substance into a vapor. In the context of the present disclosure, the term "evaporation" is to be understood as including both evaporation and sublimation, the term "evaporation temperature" is to be understood as either evaporation temperature or sublimation temperature.

Figure 4A:
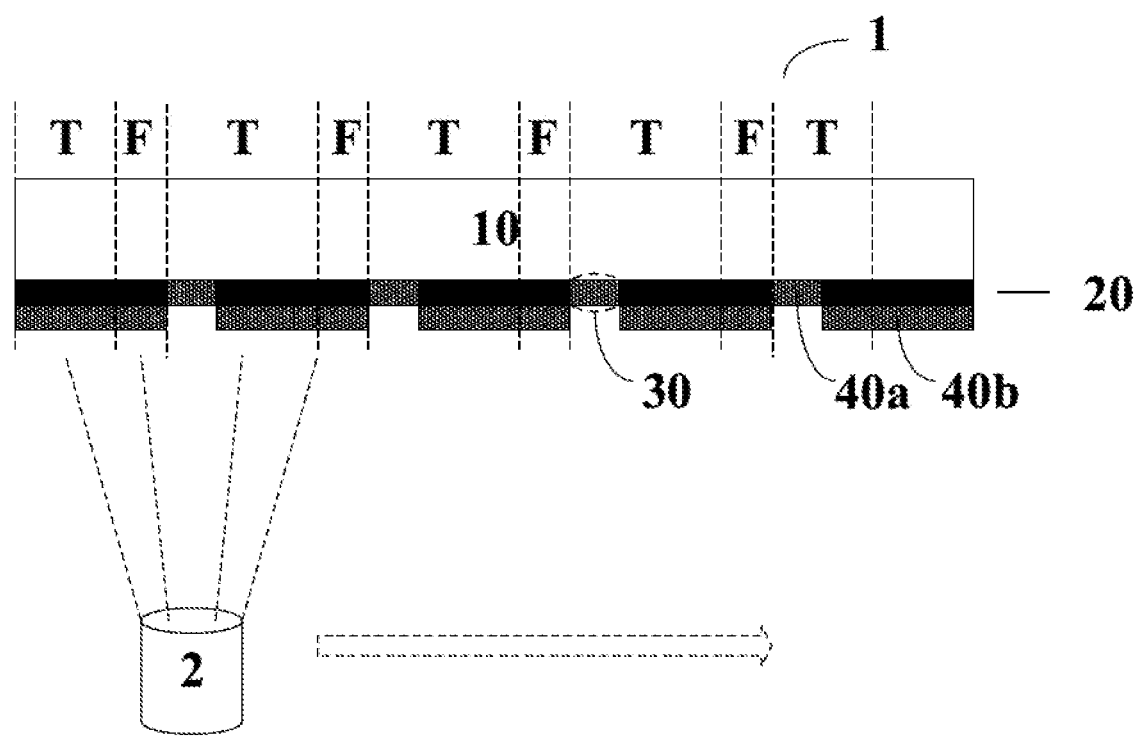
FIGS. 4A to 4D illustrate a process of depositing a deposition material on an acceptor substrate in some embodiments according to the present disclosure.

FIGS. 4A to 4D illustrate a process of depositing a deposition material on an acceptor substrate in some embodiments according to the present disclosure. Referring to FIG. 4A, a donor substrate 1 is placed above a crucible having a plurality of nozzles 2. The plurality of nozzles 2 are configured to spread an evaporated deposition material onto the donor substrate 1 both in the thermal barrier region T and in the thermal barrier-free region F. The evaporated deposition material is deposited on the base substrate 10 in a plurality of openings 30 thereby forming a first deposition material layer 40a. The evaporated deposition material is deposited on a side of the patterned thermal barrier layer 20 distal to the base substrate 10 outside the plurality of openings 30 thereby forming a second deposition material layer 40b. During the deposition process, the temperature of the donor substrate 1 may be controlled at a relatively low temperature to facilitate the deposition of the evaporated deposition material. During or subsequent to the deposition process, the temperature of the donor substrate 1 may be maintained at a relatively low temperature such that the patterned thermal barrier layer 20 and any substance deposited in the second deposition material layer 40b are maintained at a relatively low temperature in subsequent transferring process, during which the deposition material in the first deposition material layer 40a is evaporated and transferred to an acceptor substrate whereas the deposition material in the second deposition material layer 40b is substantially unevaporated.

Figure 4B:
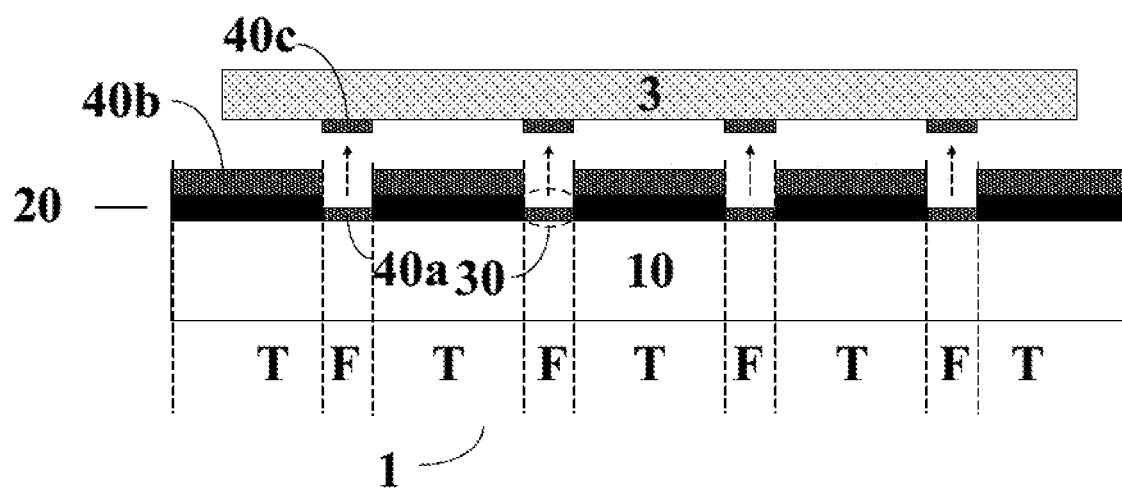

Referring to FIG. 4B, subsequent to depositing the evaporated deposition material on the donor substrate 1, an acceptor substrate 3 is placed opposite to the donor substrate 1, e.g., on a side of the patterned thermal barrier layer 20 of the donor substrate 1 distal to the base substrate 10 of the donor substrate 1. The plurality of openings 30 in the donor substrate 1 are aligned with a plurality of target regions C (see FIG. 2) in the acceptor substrate 3. The entire base substrate 10 of the donor substrate 1 is substantially uniformly heated to a first temperature at which a deposition material in the first deposition material layer 40a is evaporated. For example, the base substrate 10 in the thermal barrier region T and the thermal barrier-free region F are configured to be heated substantially uniformly and non-selectively. The donor substrate 1 does not include a heating structure configured to selectively heat the thermal barrier-free region F or selectively heat the thermal barrier region T. Due to the presence of the patterned thermal barrier layer 20 in the thermal barrier region T, the second deposition material layer 40b on the surface of the patterned thermal barrier layer 20 is blocked from the heat generated in the base substrate 10, or it takes much longer time for the heat from the base substrate 10 in the thermal barrier region T to transmit to the second deposition material layer 40b on the surface of the patterned thermal barrier layer 20. The first deposition material layer 40a on the surface of the base substrate 10 in the thermal barrier-free region F (e.g., in the plurality of openings 30) is directly heated by the base substrate 10 in the thermal barrier-free region F without the need of additional heating structure, due to the absence of the patterned thermal barrier layer 20 in the thermal barrier-free region F.

As a result, a deposition material in the first deposition material layer 40a is evaporated whereas a deposition material in the second deposition material layer 40b is substantially unevaporated when the temperature of the base substrate 10 is controlled to be at the first temperature. As shown in FIG. 4B, the deposition material evaporated from the first deposition material layer 40a is deposited into the plurality of target regions C (see FIG. 2) in the acceptor substrate 3, thereby forming a third deposition material layer 40c on the acceptor substrate 3. The substance in the first deposition material layer 40a in the plurality of openings 30 is either completely evaporated and transferred to the acceptor substrate 3, or, the first deposition material layer 40a in the plurality of openings 30 is partially evaporated and has a reduced thickness as shown in FIG. 4B.

Figure 4C:
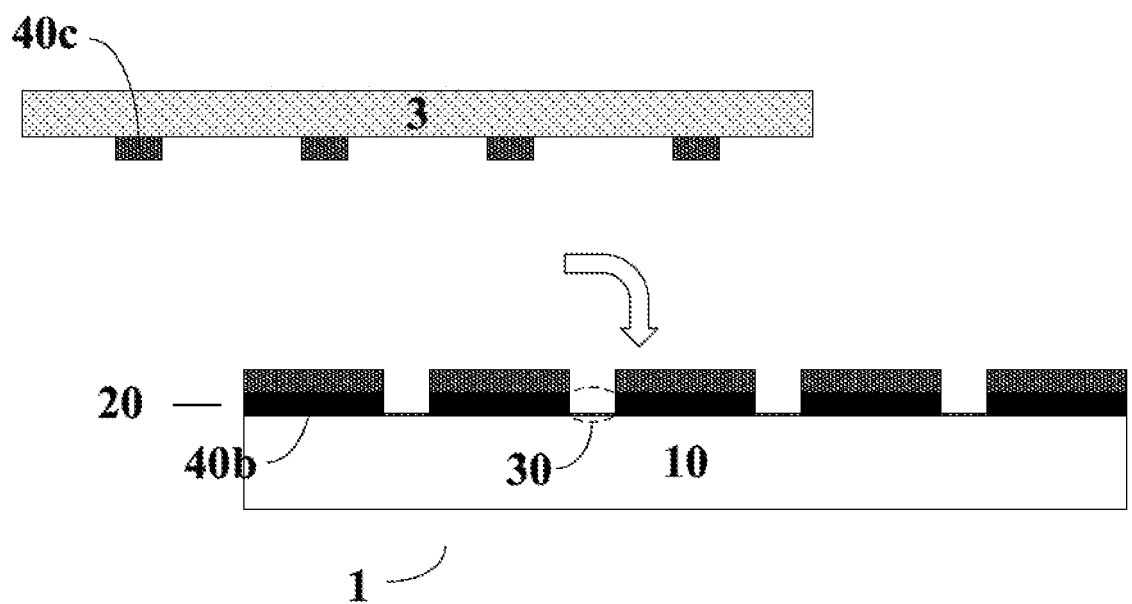

Referring to FIG. 4C, subsequent to depositing the deposition material evaporated from the first deposition material layer 40a into the plurality of target regions C (see FIG. 2) in the acceptor substrate 3, the donor substrate 1 and the acceptor substrate 3 are separated by a distance to discontinue deposition of the deposition material from the donor substrate 1 to the acceptor substrate 3. For example, the donor substrate 1 may be removed from the deposition chamber. Alternatively, both the donor substrate 1 and the acceptor substrate 3 are removed from the deposition chamber.

The heating rate and heating duration of the base substrate 10 of the donor substrate 1 can be controlled such that a deposition material in the second deposition material layer 40b is substantially unevaporated during depositing the deposition material evaporated from the first deposition material layer 40a into the plurality of target regions C in the acceptor substrate 3. For example, a relatively fast heating rate and a relative short heating duration may be used to quickly raise the temperature in the first deposition material layer 40a above evaporation/sublimation temperature whereas the temperature in the second deposition material layer 40b is maintained below evaporation/sublimation temperature due to the presence of the patterned thermal barrier layer 20. In one example, the heating rate and heating duration of the base substrate 10 of the donor substrate 1 is controlled such that the deposition material in the second deposition material layer 40b is substantially unevaporated before the donor substrate 1 and the acceptor substrate 3 are separated to discontinue deposition of the deposition material from the first deposition material layer 40a of the donor substrate 1 into the plurality of target regions C in the acceptor substrate 3.

Figure 4D:
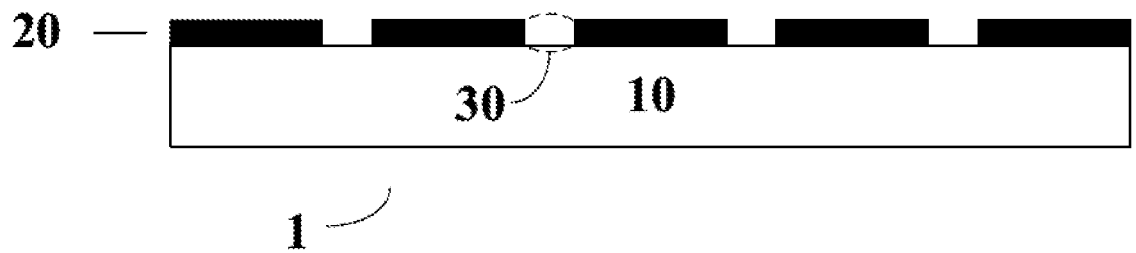

Referring to FIG. 4D, in some embodiments, subsequent to separating the donor substrate and the acceptor substrate, the donor substrate 1 is heated to remove the deposition material in the second deposition material layer 40b and any residual deposition material in the first deposition material layer 40a. Once the donor substrate 1 is cleaned, the donor substrate 1 is cooled to a temperature suitable for material deposition in the next round. For example, subsequent to the cleaning step, the temperature of the donor substrate 1 may be maintained at a relatively low temperature such that the patterned thermal barrier layer 20 and any substance deposited in the second deposition material layer 40b are maintained at a relatively low temperature in subsequent transferring process, during which the deposition material in the first deposition material layer 40a is evaporated and transferred to an acceptor substrate 3 whereas the deposition material in the second deposition material layer 40b is substantially unevaporated.

In some embodiments, deposition of a layer in the acceptor substrate 3 may be performed in multiple steps during which the base substrate 10 of the donor substrate 1 is heated and cooled reiteratively. In a first cycle, the base substrate 10 of the donor substrate 1 is substantially uniformly heated to a first temperature at which a deposition material in the first deposition material layer 40a is evaporated whereas a deposition material in the second deposition material layer 40b is substantially unevaporated. The deposition material evaporated from the first deposition material layer 40a is deposited into the plurality of target regions C in the acceptor substrate 3. The donor substrate 1 is then cooled down to prevent or avoid any evaporation of deposition material from the second deposition material layer 40b. For example, the donor substrate 1 is cooled to a second temperature at which the deposition material in the first deposition material layer 40a and the second deposition material layer 40b is substantially unevaporated. In the second cycle, the base substrate 10 of the donor substrate 1 is substantially uniformly heated to a third temperature at which a remaining deposition material in the first deposition material layer is evaporated whereas a deposition material in the second deposition material layer 40b is substantially unevaporated. At least a part of the remaining deposition material in the first deposition material layer 40a (remaining from the first cycle) is deposited into the plurality of target regions C in the acceptor substrate 3. The reiterative process is not limited to two cycles, and may be performed in more than two cycles (e.g., 3, 4, 5, or more cycles) or until the substance in the first deposition material layer 40a is completely evaporated.

Referring to FIG. 2 and FIGS. 4A to 4D, in some embodiments, the deposition material evaporated from the first deposition material layer 40a is deposited into a plurality of first regions A in the acceptor substrate 3 thereby forming a third deposition material layer 40c on the acceptor substrate 3. Each of the plurality of first regions A corresponds to one of the plurality of target regions C in the acceptor substrate 3. Each of the plurality of first regions A includes a second region B in which the third deposition material layer 40c has a substantially uniform thickness. The third deposition material layer 40c outside the second region B may have a thickness less than that in the second region B. Optionally, to ensure formation of a third deposition material layer 40c in each of the plurality of target regions C having a substantially uniform thickness, the donor substrate 1 and the structure of the plurality of openings 30 are designed such that the second region B is larger than the corresponding one of the plurality of target regions C, e.g., an orthographic projection of the second region B on the base substrate 10 covers an orthographic projection of the corresponding one of the plurality of target regions C on the base substrate 10.

In some embodiments, during depositing the deposition material evaporated from the first deposition material layer 40a into the plurality of target regions C in the acceptor substrate 3, the acceptor substrate 3 and the donor substrate 1 are spaced apart by a distance such that the second region B is larger than one of the plurality of target regions C corresponding to the second region B. Optionally, each of the plurality of first regions A is substantially non-overlapping with a target region of the plurality of target regions C adjacent thereto. Optionally, the plurality of first regions A are substantially non-overlapping with each other.

In another aspect, the present disclosure provides an evaporation apparatus. In some embodiments, the evaporation apparatus includes a donor substrate described herein or fabricated by a method described herein, and a crucible (e.g., a crucible having a plurality of nozzles) configured to deposit an evaporated deposition material on the donor substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of depositing a deposition material on into a plurality of target regions of an acceptor substrate, comprising:
    providing a donor substrate with a patterned thermal barrier layer;
    depositing an evaporated deposition material on the donor substrate; and
    heating the donor substrate thereby transferring the evaporated deposition material on the patterned thermal barrier layer to the acceptor substrate;
    wherein the donor substrate comprises:
    a base substrate;
    the patterned thermal barrier layer having a thermal conductivity at room temperature of less than 0.50 $W \cdot m^{-1} \cdot K^{-1}$ on the base substrate; and
    a plurality of openings each of which extending through the patterned thermal barrier layer;
    wherein the evaporated deposition material is deposited in the plurality of openings in direct contact with the base substrate and on the patterned thermal barrier layer in direct contact with the patterned thermal barrier layer.

2. The method of claim 1, wherein the evaporated deposition material is deposited on the base substrate in the plurality of openings thereby forming a first deposition material layer, and deposited on the patterned thermal barrier layer outside the plurality of openings thereby forming a second deposition material layer.

3. The method of claim 2, further comprising:
    providing an acceptor substrate on a side of the patterned thermal barrier layer of the donor substrate distal to the base substrate;
    substantially uniformly heating the base substrate of the donor substrate to a first temperature at which a deposition material in the first deposition material layer is evaporated; and
    depositing the deposition material evaporated from the first deposition material layer into the plurality of target regions of the acceptor substrate.

4. The method of claim 3, subsequent to depositing the deposition material evaporated from the first deposition material layer into the plurality of target regions in the acceptor substrate, further comprising:

separating the donor substrate and the acceptor substrate to discontinue deposition of the deposition material from the donor substrate to the acceptor substrate.

5. The method of claim 3, further comprising:

controlling a heating rate and a heating duration of heating the base substrate of the donor substrate such that a deposition material in the second deposition material layer is substantially unevaporated during depositing the deposition material evaporated from the first deposition material layer into the plurality of target regions in the acceptor substrate;

wherein the heating rate and the heating duration are controlled such that a second temperature of the patterned thermal barrier layer during the heating is below an evaporation temperature of the deposition material in the second deposition material layer.

6. The method of claim 4, subsequent to separating the donor substrate and the acceptor substrate, further comprising:

heating the donor substrate to remove the deposition material in the second deposition material layer and a residual deposition material in the first deposition material layer; and cooling the donor substrate.

7. The method of claim 3, subsequent to depositing the deposition material evaporated from the first deposition material layer into the plurality of target regions in the acceptor substrate, further comprising:

cooling the donor substrate to a second temperature at which the deposition material in the first deposition material layer is substantially unevaporated;

heating the base substrate of the donor substrate to a third temperature at which a remaining deposition material in the first deposition material layer is evaporated; and depositing the remaining deposition material evaporated from the first deposition material layer into the plurality of target regions in the acceptor substrate.

8. The method of claim 3, wherein the deposition material evaporated from the first deposition material layer is deposited into a plurality of first regions in the acceptor substrate thereby forming a third deposition material layer on the acceptor substrate, each of the plurality of first regions corresponding to one of the plurality of target regions in the acceptor substrate; and each of the plurality of first regions comprises a second region in which the third deposition material layer has a substantially uniform thickness.

9. The method of claim 8, wherein, during depositing the deposition material evaporated from the first deposition material layer into the plurality of target regions in the acceptor substrate, the acceptor substrate and the donor substrate are spaced apart by a distance such that the second region is larger than one of the plurality of target regions corresponding to the second region, and each of the plurality of first regions is substantially non-overlapping with a target region of the plurality of target regions adjacent thereto.

10. The method of claim 9, wherein the plurality of first regions are substantially non-overlapping with each other.

11. The method of claim 1, prior to depositing the evaporated deposition material on the donor substrate, further comprising cooling the donor substrate.

12. The method of claim 1, wherein heating the donor substrate comprises at least one of:

heating a heating layer of the base substrate, the heating layer is on a side of the patterned thermal barrier layer away from the evaporated deposition material; or distributing heat produced by a heat spreading layer to the patterned thermal barrier layer, and the evaporated deposition material in the plurality of openings, the heat spreading layer is on a side of the patterned thermal barrier layer away from the evaporated deposition material;

wherein the heating layer or the heat spreading layer is in direct contact with the evaporated deposition material in the plurality of openings, and is spaced apart by the patterned thermal barrier layer from the evaporated deposition material in direct contact with the patterned thermal barrier layer.

* * * * *